(12) United States Patent
Ahn et al.

(10) Patent No.: US 10,876,020 B2
(45) Date of Patent: Dec. 29, 2020

(54) POLISHING ADDITIVE COMPOSITION, POLISHING SLURRY COMPOSITION AND METHOD FOR POLISHING INSULATING FILM OF SEMICONDUCTOR ELEMENT

(71) Applicant: SOULBRAIN CO., LTD., Seongnam-si (KR)

(72) Inventors: Ja Hwa Ahn, Seongnam-si (KR); Myeong Hoon Han, Seongnam-si (KR)

(*) Notice: Subject to any disclaimer, the term of this patent is extended or adjusted under 35 U.S.C. 154(b) by 0 days.

(21) Appl. No.: 16/226,654

(22) Filed: Dec. 20, 2018

(65) Prior Publication Data
US 2020/0157381 A1    May 21, 2020

(30) Foreign Application Priority Data
Nov. 15, 2018  (KR) .................. 10-2018-0140959

(51) Int. Cl.
| | | |
|---|---|---|
| C09G 1/02 | (2006.01) | |
| C09G 1/16 | (2006.01) | |
| B24B 37/24 | (2012.01) | |
| H01L 21/321 | (2006.01) | |
| H01B 3/12 | (2006.01) | |
| B24B 37/04 | (2012.01) | |
| H01L 21/3105 | (2006.01) | |

(52) U.S. Cl.
CPC ............. C09G 1/02 (2013.01); B24B 37/044 (2013.01); B24B 37/24 (2013.01); C09G 1/16 (2013.01); H01B 3/12 (2013.01); H01L 21/3212 (2013.01); H01L 21/31053 (2013.01)

(58) Field of Classification Search
CPC ......... H01L 21/30625; H01L 21/31053; H01L 21/3212; C09G 1/02; C09G 1/04; C09K 3/1463
USPC .................. 438/692, 693; 252/79.1, 79.4
See application file for complete search history.

(56) References Cited

U.S. PATENT DOCUMENTS

| | | | | |
|---|---|---|---|---|
| 4,404,377 A | * | 9/1983 | Seale .................. | B01F 17/0042 544/177 |
| 6,221,118 B1 | * | 4/2001 | Yoshida ................... | C09G 1/02 51/309 |

(Continued)

FOREIGN PATENT DOCUMENTS

| | | | |
|---|---|---|---|
| KR | 1020080016979 A | 2/2008 | |
| KR | 101470979 B1 | 12/2014 | |

OTHER PUBLICATIONS

Wikipedia, The Free Encylopedia, "Dispesity" via https://en.wikipedia.org/wiki/Dispersity ; pp. 1-4; 2019.*

(Continued)

*Primary Examiner* — Binh X Tran
(74) *Attorney, Agent, or Firm* — Jongkook Park

(57) ABSTRACT

The present invention relates to a method for polishing an insulating film of a semiconductor element, the method comprising polishing an insulating film, which is formed by embedding conductive patterns formed on a substrate, with a polishing slurry composition comprising a polishing agent including cerium oxide particles and an anionic dispersant, and a polishing additive composition comprising an anionic polymer, a cationic compound, a nonionic surfactant, a dishing inhibitor, and an amphoteric ionic compound, wherein the anionic polymer has a polymer distribution index (PDI) of 3.5 to 5.5, to remove a step associated with the insulating film.

16 Claims, 3 Drawing Sheets

(56) References Cited

U.S. PATENT DOCUMENTS

| | | | |
|---|---|---|---|
| 2004/0266196 A1* | 12/2004 | De Rege Thesauro | ..................... H01L 21/3212 438/698 |
| 2006/0000150 A1* | 1/2006 | Kelley | .................... C09G 1/04 51/298 |
| 2010/0178767 A1* | 7/2010 | Schubert | ............. H01L 21/3212 438/692 |
| 2013/0244433 A1* | 9/2013 | Reiss | ................ H01L 21/30625 438/693 |

OTHER PUBLICATIONS

Agilent Technologies, "Polymer Molecular weight Distribution and Definitions of MW Averages", via https://www.agilent.com/cs/library/technicaloverviews/Public/5990-7890EN.pdf; 2015.*

* cited by examiner

POLISHING ADDITIVE COMPOSITION, POLISHING SLURRY COMPOSITION AND METHOD FOR POLISHING INSULATING FILM OF SEMICONDUCTOR ELEMENT

CROSS-REFERENCE TO RELATED APPLICATIONS

This application claims priority under 35 U.S.C. § 119 to Korean Patent Application No. 10-2018-0140959, filed on Nov. 15, 2018, in the Korean Intellectual Property Office, the disclosure of which is incorporated herein by reference in its entirety.

TECHNICAL FIELD

The following disclosure relates to a polishing additive composition, a polishing slurry composition, and a method for polishing an insulating film of a semiconductor, which are capable of reducing the loss of a nitride film acting as a polishing stopper film of a semiconductor element and increasing the selectivity of an oxide film to the nitride film, thereby reducing the loss of an oxide film in a trench portion to achieve reduced dishing.

BACKGROUND

Among the process for manufacturing a semiconductor device, the chemical mechanical polishing (CMP) process is one of the planarization techniques used for removing a step in an insulating film formed on a substrate. In the CMP process, the polishing process is performed by placing the wafer to be subjected to a planarization process on a platen, contacting a surface of the wafer with the polishing pad of a polisher, and then rotating the rotating plate and the pad of the polisher while supplying a slurry. In other words, the slurry flows between the wafer surface and the pad, such that polishing of the wafer surface is performed by mechanical friction caused by polishing particles in the slurry and surface protrusions of the pad, while chemical removal is simultaneously achieved through chemical reaction between the chemical components in the slurry and the wafer surface.

In particular, the shallow trench isolation (STI) process performs the CMP process by controlling the selectivity between silicon oxide and silicon nitride films. Here, the loss of the silicon oxide film in a trench portion is prevented by using a silicon nitride film as a polishing stopper film. In recent years, the pattern density of silicon nitride films has tended to decrease due to miniaturization of the process, and thus there are problems in that there is increased erosion of the silicon nitride film used as the polishing stopper during the polishing process, leading to increased dishing together with the loss of the oxide film of the trench portion.

In addition, in the case of conventional polishing slurry products, in order to reduce the dishing, the passivation performance of the silicon oxide film is improved to reduce the polishing rate of the silicon oxide film, and thus there are problems in that the selectivity of the silicon oxide film to the silicon nitride film used as the polishing stopper film is low, at 20:1, thereby causing increased erosion of the silicon nitride film used as the polishing stopper.

In order to solve the above problems, Korean Patent No. 1470979 discloses a slurry composition implemented with a high polishing selectivity of a nitride film or a poly film to an oxide film, wherein the slurry may have high dispersibility and the occurrence of micro-scratches during the polishing process may be reduced, but there is no consideration regarding the reduction of dishing, which may be achieved by reducing loss of the silicon oxide film. In addition, Korean Open Patent No. 2008-0016979 discloses a CMP polishing agent for polishing a silicon oxide insulating film at a high speed without scratching, but has a problem in that reduction of erosion, achieved through reduction of the loss of the silicon nitride film, and reduction of dishing, which may be achieved by reducing the loss of the silicon oxide film in the trench portion, are still not achieved.

In conclusion, it is important to reduce the loss of the silicon nitride film and the loss of the oxide film at the same time, thereby preventing erosion and reducing dishing while maintaining a high oxide film/nitride film selectivity, in order to reduce polishing loss and achieve a high flatness as the semiconductor process becomes more miniaturized and highly integrated.

Patent Literature 1: KR1470979
Patent Literature 2: KR2008-0016979

SUMMARY

Figure 1:
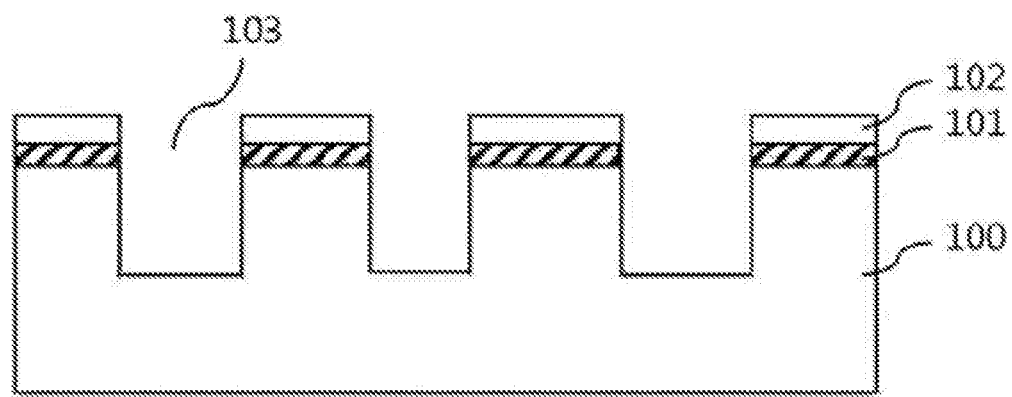
FIG. 1 illustrates a stacked structure in which a plurality of trenches is formed according to the method for polishing an insulating film of a semiconductor element of the present invention.

An embodiment of the present invention is directed to providing a polishing additive composition capable of reducing the loss of a silicon nitride film to prevent erosion, while simultaneously reducing the loss of a silicon oxide film to improve dishing in a process for manufacturing a semiconductor, and a polishing slurry composition comprising the same.

In addition, another embodiment of the present invention is directed to providing a polishing method capable of increasing the selectivity of the silicon oxide film/silicon nitride film to reduce polishing loss of the insulating film of the semiconductor.

To solve the above-mentioned problems, an embodiment of the present invention provides a polishing additive composition comprising an anionic polymer, a cationic compound, a nonionic surfactant, a dishing inhibitor, and an amphoteric ionic compound, wherein the anionic polymer has a polymer distribution index (PDI) of 3.5 to 5.5.

Another embodiment of the present invention provides a polishing slurry composition comprising cerium oxide particles, an anionic dispersant, and the polishing additive composition.

Yet another embodiment of the present invention provides a method for polishing an insulating film of a semiconductor element, the method comprising a step of polishing an insulating film, which is formed on a substrate, with the polishing slurry composition to remove a step associated with the insulating film.

DETAILED DESCRIPTION OF EMBODIMENTS

The present invention provides a polishing additive composition.

The polishing additive composition may comprise an anionic polymer, a cationic compound, a nonionic surfactant, a dishing inhibitor, and an amphoteric ionic compound.

The shallow trench isolation (STI) process is generally performed at about pH 5 since the zeta potentials of the surfaces of a silicon oxide film and a silicon nitride film are opposite to each other at about pH 5. The silicon nitride film has a positive ion charge. By using this characteristic, a polymer having an anionic group may be employed to enhance the passivation of the silicon nitride film, and thus the occurrence of polishing of the silicon nitride film during a polishing process may be prevented.

The anionic polymer employed in the present invention may prevent a polishing agent from coming into contact with the silicon nitride film through the occurrence of bonding between the anionic group and the surface of the silicon nitride film, thereby increasing the selectivity of the silicon oxide film to the silicon nitride film, while additionally acting as a pH buffer to thereby maintain the pH of the polishing slurry at a predetermined level.

The anionic polymer may be a polymer comprising a repeating unit derived from at least one monomer selected from the group consisting of acrylic acid, methacrylic acid, maleic acid, and styrenesulfonic acid, or a blend thereof.

The anionic polymer may be at least one polymer selected from the group consisting of polyacrylic acid, polymethacrylic acid, polymaleic acid, and polystyrene sulfonic acid.

The anionic polymer may have a polymer distribution index (PDI) of 3.5 to 5.5. More specifically, the PDI of the anionic polymer may be 4.0 to 5.0. When the PDI thereof is less than 3.5, passivation of the silicon nitride film is lowered, thus resulting in significant occurrence of the erosion phenomenon, and when the PDI thereof exceeds 5.5, the polishing efficiency of the silicon oxide film increases, thus resulting in reduction of an effect of inhibiting the dishing.

In the case of the anionic polymer, adsorption behavior to the silicon nitride film varies according to the molecular weight of the polymer. When the polymer has a relatively low molecular weight, the adsorption area per unit weight is relatively large, but the adsorbed anionic polymer layer is relatively thin. On the contrary, when the polymer has a relatively high molecular weight, the adsorption area per unit weight is relatively small, but the adsorbed anionic polymer layer is relatively thick. When the polymer has a high PDI value, the distribution of the molecular weight of the polymer increases, and thus it is possible to employ both the polymer adsorption characteristics of the small molecular weight polymers and the characteristics of the high molecular weight polymers. Therefore, when the anionic polymer has a high PDI value, the passivation effect for the silicon nitride film may be enhanced, thus leading to deterioration of loss of the silicon nitride film, as compared to the case where the anionic polymer has a low PDI value.

The weight average molecular weight (g/mol) of the anionic polymer may be 10,000 to 50,000. When the weight average molecular weight of the anionic polymer is less than 10,000, the polishing rate of the silicon oxide film may decrease. When the weight average molecular weight thereof exceeds 50,000, the dishing of the silicon oxide film may increase.

In addition, the anionic polymer may comprise a blend of two or more polymers having different weight average molecular weights. By mixing two or more polymers having different weight average molecular weights, the polishing additive composition of the present invention may have increased polymer weight distribution, thereby resulting in an increase in the PDI value, and thus it is possible to further increase the selectivity of the silicon nitride film in a pattern portion, thereby leading to improvement of dishing.

The polishing additive composition may comprise the anionic polymer in an amount of 0.2 to 2 parts by weight. When the amount of the anionic polymer is less than 0.2 parts by weight, there is a problem in that the selectivity of the silicon oxide film to the silicon nitride film is lowered. When the amount of the anionic polymer exceeds 2 parts by weight, there is a possibility that loss of the oxide film in the trench portion may increase, thus causing an increase in dishing.

The cationic compound serves to improve the passivation of the field oxide film of the wafer of the semiconductor. In particular, the cationic compound simultaneously comprises a hydrophilic moiety and a hydrophobic moiety within the molecule, and it may be adhered to the hydrophilic silicon oxide film so that the surface of the silicon oxide film, which is the film to be polished, is modified to be hydrophobic, thus resulting in the inhibition of dishing.

As the cationic compound, any compound may be employed without limitation as long as it is a compound having a cationic functional group. Specifically, the cationic compound may be a compound containing nitrogen (N) in the molecule.

For example, the cationic compound may be amine compound, and more specifically, may be tris[2-(isopropylamino)ethyl]amine, tris[2-(ethylamino)ethyl]amine, tris[2-(methylamino)ethyl]amine, 1,2-bis(dimethylamino)ethane (BDMAE), N,N,N',N'-tetraethylethylenediamine, N,N'-diethyl-N,N'-diethylethylenediamine, N,N-diethyl-N',N'-dimethylethylenediamine, N,N,N',N'',N''-pentamethyldiethylenetriamine (PMDETA), N,N'-dimethylethylenediamine, N,N'-diethylethylenediamine, N,N'-bis(2-hydroxyethyl)ethylenediamine, N,N-dimethyl-N'-ethylethylenediamine, N,N-diethyl-N'-methylethylenediamine, N,N,N'-trimethylethylene diamine, N,N,N'-triethylethylenediamine, N-ethyl-N'-methylethylenediamine, 1-(2-aminoethyl)pyrrolidine, 2-(2-(methylamino)-ethylamino)-ethanol, 1-(2-aminoethyl)piperidine, 4-(3-aminopropyl)morpholine, 4-(2-aminoethyl)morpholine, piperazine (PZ), 1-methylpiperazine, 2-methylpiperazine, 1-ethylpiperazine, 1-isopropylpiperazine, 1-butylpiperazine, 1-(2-methoxyethyl)piperazine, 1-(2-ethoxyethyl)piperazine, 1,2,4-trimethyl piperazine, 2,3,5,6-tetramethylpiperazine, 1-(2-aminoethyl)piperazine, 1-(2-hydroxyethyl)piperazine (HEPZ), [1,4-dimethylpiperazine], 2,6-dimethyl piperazine, 2,5-dimethylpiperazine, 2-piperazinoethylamine, 1,4-bis(3-aminopropyl)piperazine, 1-[2-(dimethylamino)ethyl]piperazine, N,N'-bis-(2-hydroxyethyl)-2,5-dimethylpiperazine, 1,4-diazepane, 1-methyl-1,4-diazepane, 1,4-dimethyl-1,4-diazepane, 1,4,7-triazacyclononane, 1,4,8,11-tetraazacyclotetradecane, and combinations thereof, but the cationic compound is not limited thereto.

The polishing additive composition may comprise the cationic compound in an amount of 0.01 to 5 parts by weight. When the amount of the cationic compound is less than 0.01 parts by weight, passivation of the field oxide film is not enhanced. When the amount of the cationic compound exceeds 5 parts by weight, the polishing rate of the silicon oxide film becomes slow, and thus it is difficult to effectively remove the silicon oxide film, which is the film to be polished.

The nonionic surfactant may improve the fluidity of the polishing additive composition, and when the nonionic surfactant is included in the polishing slurry composition, polishing uniformity may be improved.

The nonionic surfactant may comprise at least one selected from the group consisting of glycerin, polyglycerin, polyvinylpyrrolidone, polypolyalkylene glycol and polyvinyl alcohol.

The polishing additive composition may comprise the nonionic surfactant in an amount of 0.01 to 10 parts by weight. When the amount of the nonionic surfactant is less than 0.01 parts by weight, fluidity may be reduced due to the low viscosity of the polishing additive composition. When the amount of the nonionic surfactant exceeds 10 parts by weight, scratches may occur during the polishing process due to impaired dispersion stability of the polishing agent.

The dishing inhibitor may alter the rheological properties of the polishing slurry composition according to the shear. Specifically, the temperature of a wafer is raised up to 80° C. during the polishing process, and thus it is necessary to minimize the change in viscosity depending on the change in temperature. Accordingly, by employing the dishing inhibitor, the rate of change in viscosity according to the temperature change may be relatively reduced to enhance passivation of the field oxide film of a patterned wafer without lowering the polishing rate of the silicon oxide film, thereby inhibiting the occurrence of dishing.

The dishing inhibitor comprises at least one selected from the group consisting of polyamino acid-based polymers, polyurethane-based polymers, and polysaccharide-based polymers.

The polyamino acid-based polymer may be a homopolymer derived from one amino acid, a copolymer derived from two or more amino acids, or a mixture thereof. Specifically, the amino acid may include Alanine, Cysteine, Aspartic acid, Glutamic acid, Phenylalanine, Glycine, Histidine, Isoleucine, Lysine, Leucine, Methionine, Asparagine, Pyrrolysine, Proline, Glutamine, Arginine, Serine, Threonine, Valine, Tryptophan, Tyrosine, and the like.

Any polyurethane-based polymer may be employed without limitation as long as it is a polyurethane-based polymer prepared by a polymerization reaction of a diisocyanate compound and a polyol, and specifically, it may be a polymer of which a terminal is modified to a water-soluble functional group. For example, the polymer can be a urethane diol oligomer of which the terminal is modified to a hydroxy group, or a urethane polymer of which the terminal is modified to a hydroxy group.

The polysaccharide-based polymer may be a homopolymer of one monosaccharide, a copolymer of two or more monosaccharides, or a mixture thereof, and specific examples of the monosaccharide may include, but are not limited to, glycolaldehyde, glyceraldehyde, dihydroxyacetone, threose, erythrose, erythrulose, ribose, arabinose, xylose, fructose, glucose, galactose, mannose, and the like.

Specifically, it may include at least one selected from a group consisting of polygalacturonic acid, amylose, dextrin, isomaltotriose, cellopentaose, glycol chitosan, Xanthan gum, hydroxyethyl-cellulose, (hydroxypropyl)methyl cellulose, and agarose.

The polishing additive composition may comprise the dishing inhibitor in an amount of 0.001 to 1 parts by weight. When the amount of the dishing inhibitor is less than 0.001 parts by weight, the passivation of the field oxide film of the patterned wafer is weakened, and thus the effect of inhibiting the dishing is lowered. When the amount of the dishing inhibitor exceeds 1 part by weight, scratches may occur during the polishing process, and the overall polishing rate may be lowered.

The anionic group of the amphoteric ionic compound is bonded to the surface of the silicon nitride film so that the cationic group faces outward, and the amphoteric ionic compound bonded to the silicon nitride film may prevent the polishing agent from coming into contact with the silicon nitride film, thereby enhancing the passivation of the silicon nitride film.

The amphoteric ionic compound may comprise at least one selected from the group consisting of an amino acid and an amino alcohol.

Examples of the amino acid may specifically include Alanine, Cysteine, Aspartic acid, Glutamic acid, Phenylalanine, Glycine, Histidine, Isoleucine, Lysine, Leucine, Methionine, Asparagine, Pyrrolysine, Proline, Glutamine, Arginine, Serine, Threonine, Valine, Tryptophan, Tyrosine, and the like.

The amino alcohol may be, but is not limited to, methanol amine, ethanol amine, propanol amine, butanol amine, phenol amine, dimethanol amine, diethanol amine, triethanol amine, tripropanol amine, amino methyl propanol, heptaminol, dimethyl ethanol amine, N-methyl ethanol amine, or derivatives thereof.

The polishing additive composition may comprise the amphoteric ionic compound in an amount of 0.01 to 0.5 parts by weight. When the amount of the amphoteric ionic compound is less than 0.01 parts by weight, polishing loss of the silicon nitride film occurs, thus resulting in a significant increase in erosion. When the amount of the amphoteric ionic compound exceeds 0.5 parts by weight, the dispersion stability of the slurry composition is deteriorated, thus resulting in occurrence of scratches during the polishing process.

The polishing additive composition may further comprise a residual solvent, wherein any solvent may be employed as long as it is a solvent used in a slurry composition for a chemical mechanical polishing process. For example, the solvent may be deionized water, but it is not limited thereto.

In addition, the present invention provides a polishing slurry composition.

The polishing slurry composition may comprise a polishing agent comprising cerium oxide particles and an anionic dispersant; and the polishing additive composition described above.

Cerium oxide particles achieve a very high polishing rate on surfaces containing silicon, such as glass or semiconductor substrates, through a chemical polishing mechanism in which Si—O—Ce bonds are formed between Si and Ce atoms, and the particle hardness is low, thus cerium oxide particles are particularly suitable for the STI process.

The surface of the cerium oxide particles may be negatively charged (−). In other words, the zeta potential of the surface of the cerium oxide particles may be −30 mV to −50 mV. As the zeta potential of the surface of the cerium oxide particles has a negative value, polished particles can be evenly distributed, thereby facilitating improvement of the polishing efficiency and polishing rate.

The cerium oxide particles may be particles prepared by a liquid phase method such as the sol-gel method, a coprecipitation method, a hydrothermal synthesis method, or the like. When cerium oxide particles prepared by the liquid phase method are employed, due to the near-spherical shape of the particles, the occurrence of micro-scratches during the polishing process may be reduced, and the overall polishing rate may be set more uniformly.

The polishing agent may comprise the cerium oxide particles in an amount of 0.1 to 2 parts by weight. When the amount of the cerium oxide particles is less than 0.1 parts by weight, the overall polishing rate tends to decrease. When the amount of the cerium oxide particles exceeds 2 parts by weight, scratches and polishing grooves tend to occur in the film to be polished.

Regarding the particle size of the cerium oxide particles, the primary particle size (measurement of BET surface area) may be 10 nm to 80 nm, and the secondary particle size may be 80 nm to 200 nm, in consideration of scratches and the polishing rate. When the primary particle size of the cerium oxide particles is less than 10 nm, the cleaning performance and the polishing rate may be lowered, thus resulting in deterioration of the polishing efficiency with respect to the silicon oxide film. When the primary particle size thereof exceeds 80 nm, dispersion stability may be impaired, and thus surface defects such as scratches may occur. Further, when the secondary particle size of the cerium oxide particles is less than 80 nm, the polishing rate may be slow, and when the secondary particle size thereof exceeds 200 nm, polishing defects may occur.

The anionic dispersant serves to enhance the dispersibility of the polishing slurry composition.

The anionic dispersant may comprise a polymer containing a carboxyl group, and may specifically comprise at least one selected from the group consisting of polymaleic acid, polystyrene sulfonic acid, polyacrylic acid, polymethacrylic acid, and a salt thereof. The salt may comprise, but is not limited to, an ammonium salt.

The anionic dispersant may have a weight average molecular weight of 10,000 to 100,000 g/mol.

The polishing agent may comprise the anionic dispersant in an amount of 0.5 to 10 parts by weight based on the polishing particles. When the amount of the anionic dispersant is less than 0.5 parts by weight, the polishing particles are not sufficiently dispersed, and thus a problem in dispersion stability may occur. When the amount thereof exceeds 10 parts by weight, an agglomeration phenomenon may occur between the polishing particles, and thus defects or scratches may occur during the polishing process.

The polishing slurry composition may comprise the polishing agent in an amount of 5 to 15 parts by weight. When the amount of the polishing agent is less than 5 parts by weight, the polishing rate of a patterned wafer may be lowered during the polishing process. When the amount of the polishing agent exceeds 15 parts by weight, scratches or defects may occur on the film to be polished.

The polishing slurry composition may comprise the polishing additive composition in an amount of 10 to 25 parts by weight. When the amount of the polishing additive composition is less than 10 parts by weight, polishing loss may occur in the field oxide film of the patterned wafer during the polishing process, or the passivation of the silicon nitride film may be weakened, and thus erosion or dishing phenomena may occur. When the amount thereof exceeds 25 parts by weight, scratches may occur during the polishing process, or the overall polishing rate may be lowered.

The polishing slurry composition may further comprise a residual solvent, wherein any solvent may be employed as long as it is a solvent used in a slurry composition for a chemical mechanical polishing process. For example, the solvent may be deionized water, but it is not limited thereto.

Further, the present invention provides a method for polishing an insulating film of a semiconductor.

FIG. 1 illustrates a stacked structure in which a plurality of trenches is formed according to the method for polishing an insulating film of a semiconductor element of the present invention.

The method for polishing an insulating film of a semiconductor element may comprise a step of polishing an insulating film, which is formed by embedding conductive patterns formed on a substrate, with the polishing slurry composition described above to remove a step associated with the insulating film.

In the method for polishing an insulating film of a semiconductor element, the step of polishing the insulating film may be performed by placing the substrate on a rotating plate, the substrate having the insulating film formed thereon, contacting a surface of the insulating film with the polishing pad of a polisher, and rotating the rotating plate and the polishing pad while supplying the polishing slurry composition.

Referring to FIG. 1, a pad silicon oxide film ($SiO_2$) 101 and a silicon nitride film (SiN) 102 are sequentially stacked on a semiconductor substrate 100, and then photosensitive resin patterns are formed on the silicon nitride film 102. Next, the silicon nitride film 102, the pad silicon oxide film 101, and the semiconductor substrate 100 are partially etched to form a plurality of trenches 103 through light exposure using the photoresist patterns as a mask.

Figure 2:
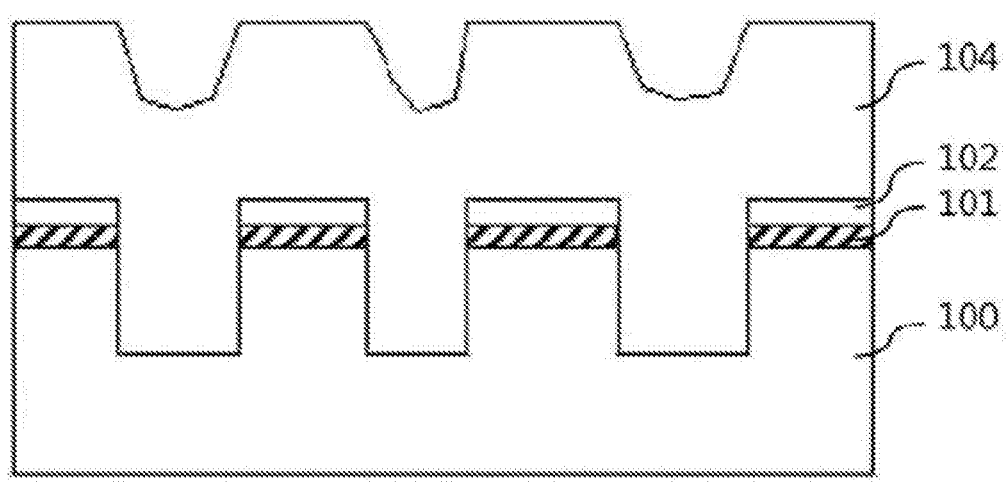
FIG. 2 illustrates a stacked structure in which an insulating silicon oxide film is formed on the trenches according to the method for polishing an insulating film of a semiconductor element of the present invention.

Referring to FIG. 2, in order to form a field region, the trenches 103 are filled and an insulating silicon oxide film 104 is deposited on the trenches 103 through low pressure chemical vapor deposition (LPCVD), plasma-enhanced chemical vapor deposition (PECVD), or high density plasma chemical vapor deposition so as to cover the surface of the silicon nitride film 102.

Here, the residual photoresist can be removed by asking before deposition of the silicon oxide 104, and then a liner oxide film may be formed to enable easy deposition of the insulating silicon oxide film 104.

Figure 3:
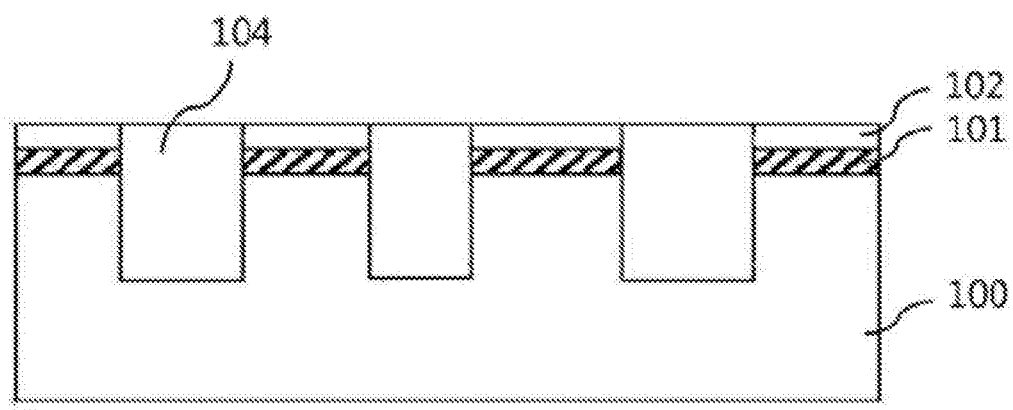
FIG. 3 illustrates a stacked structure planarized by polishing a silicon oxide insulating film according to the method for polishing an insulating film of a semiconductor element of the present invention.

As can be seen in FIG. 2, a step is formed on the insulating silicon oxide film due to the trenches. Referring to FIG. 3, planarization of the insulating silicon oxide film 104 may be achieved by polishing using the polishing slurry composition described above until the silicon nitride film 102 is exposed.

When a chemical mechanical polishing process is performed using the above-described polishing slurry composition of the present invention, the polishing process is automatically stopped depending on the difference in polishing rate according to the quality of the film to be polished in the pattern part (i.e., the polishing rate is high for the silicon oxide film and the polishing rate is very low for the silicon nitride film). In general, when chemical mechanical polishing is employed, over polishing is performed to prevent defects in a subsequent etching process for the silicon nitride film due to residual silicon oxide film. In addition, when over polishing is performed, generally, loss of the silicon nitride film, which acts as the polishing stopper film, and loss of the oxide in the field region may occur, leading to erosion and dishing.

Here, the polishing additive composition of the present invention comprises the above-described anionic polymer having a high PDI value as described above, and thus, when the polishing slurry composition using the same is employed, the loss of the nitride film may be effectively inhibited, thus resulting in inhibition of the occurrence of erosion and dishing to achieve stable polishing of the STI pattern wafer.

Specifically, in the method for polishing an insulating film of a semiconductor element, the step of polishing the insulating film may be performed by placing a substrate (wafer) on which the insulating film to be subjected to planarization is formed onto a rotating plate, contacting a surface of the insulating film with the polishing pad of a polisher, and rotating the rotating plate and the polishing pad while supplying the polishing slurry composition of the present invention.

Any rotating plate and polishing pad may be used without limitation, as long as they are used in a polishing apparatus used in a conventional chemical mechanical polishing process.

The insulating layer may comprise a silicon oxide layer and a silicon nitride layer. Here, the selectivity of the silicon oxide film and the silicon nitride film may be 30:1 or higher.

According to the method for polishing an insulating film of a semiconductor element, the dishing level of the silicon oxide film may be 600 Å or less, and specifically, 550 Å or less. Here, the dishing level means the thickness of the silicon oxide film lost due to over polishing of the surface of the silicon nitride film, which is at the position of the polishing stop.

In addition, according to the method for polishing an insulating film of a semiconductor element, the erosion of the silicon nitride film may be 50 Å or less, and specifically, 45 Å or less.

Further, the present invention also provides a semiconductor formed using the method for polishing an insulating film of a semiconductor element described above.

Preparation Example 1

A polishing additive composition was prepared by mixing 0.5 parts by weight of polyacrylic acid having a weight average molecular weight of 25,000 g/mol, 0.1 parts by weight of a cationic compound, 0.1 parts by weight of a nonionic surfactant, 0.2 parts by weight of a dishing inhibitor, 0.1 parts by weight of an amphoteric ionic compound, and a residual solvent (deionized water). Here, the PDI of the polyacrylic acid was 4.57.

Preparation Example 2

A polishing additive composition was prepared in the same manner as in Preparation Example 1, except that 0.1 parts by weight of polyacrylic acid having a weight average molecular weight of 10,000 g/mol and 0.4 parts by weight of polyacrylic acid having a weight average molecular weight of 25,000 g/mol were mixed instead of 0.5 parts by weight of polyacrylic acid having a weight average molecular weight of 25,000 g/mol. Here, the PDI of the polyacrylic acid mixture was 4.13.

Preparation Example 3

A polishing additive composition was prepared in the same manner as in Preparation Example 1, except that 0.4 parts by weight of polyacrylic acid having a weight average molecular weight of 25,000 g/mol and 0.1 parts by weight of polyacrylic acid having a weight average molecular weight of 40,000 g/mol were mixed instead of 0.5 parts by weight of polyacrylic acid having a weight average molecular weight of 25,000 g/mol. Here, the PDI of the polyacrylic acid mixture was 4.06.

Preparation Example 4

A polishing additive composition was prepared in the same manner as in Preparation Example 1, except that 0.1 parts by weight of polyacrylic acid having a weight average molecular weight of 10,000 g/mol, 0.3 parts by weight of polyacrylic acid having a weight average molecular weight of 25,000 g/mol, and 0.1 parts by weight of polyacrylic acid having a weight average molecular weight of 40,000 g/mol were mixed instead of 0.5 parts by weight of polyacrylic acid having a weight average molecular weight of 25,000 g/mol. Here, the PDI of the polyacrylic acid mixture was 4.38.

Comparative Preparation Example 1

A polishing additive composition was prepared in the same manner as in Preparation Example 1, except that 0.5 parts by weight of polyacrylic acid having a weight average molecular weight of 10,000 g/mol was mixed instead of 0.5 parts by weight of polyacrylic acid having a weight average molecular weight of 25,000 g/mol. Here, the PDI of the polyacrylic acid was 2.84.

Comparative Preparation Example 2

A polishing additive composition was prepared in the same manner as in Preparation Example 1, except that the PDI of the polyacrylic acid employed was 3.18.

Comparative Preparation Example 3

A polishing additive composition was prepared in the same manner as in Preparation Example 1 except that 0.5 parts by weight of polyacrylic acid having a weight average molecular weight of 40,000 g/mol was mixed instead of 0.5 parts by weight of polyacrylic acid having a weight average molecular weight of 25,000 g/mol. Here, the PDI of the polyacrylic acid was 2.22.

Comparative Preparation Example 4

A polishing additive composition was prepared in the same manner as in Preparation Example 1, except that the PDI of the polyacrylic acid employed was 2.21.

Example 1

Cerium carbonate hydrate was calcined in air at 750° C. for 4 hours to prepare cerium oxide particles. Then, deionized water and a small amount of a dispersant were added thereto, and the obtained particles were pulverized with a medium agitating powder mill, dispersed, and classified to obtain a cerium oxide dispersion. The cerium oxide dispersion had a solid content of 5% by weight, a secondary particle size of 130 nm, and a pH of 8.5.

The resulting cerium oxide dispersion was mixed with the polishing additive composition of Preparation Example 1, thereby preparing a polishing slurry composition.

Example 2

A polishing slurry composition was prepared by mixing the cerium oxide dispersion prepared in Example 1 with the polishing additive composition of Preparation Example 2.

Example 3

A polishing slurry composition was prepared by mixing the cerium oxide dispersion prepared in Example 1 with the polishing additive composition of Preparation Example 3.

Example 4

A polishing slurry composition was prepared by mixing the cerium oxide dispersion prepared in Example 1 with the polishing additive composition of Preparation Example 4.

Comparative Example 1

A polishing slurry composition was prepared by mixing the cerium oxide dispersion prepared in Example 1 with the polishing additive composition of Comparative Preparation Example 1.

Comparative Example 2

A polishing slurry composition was prepared by mixing the cerium oxide dispersion prepared in Example 1 with the polishing additive composition of Comparative Preparation Example 2.

Comparative Example 3

A polishing slurry composition was prepared by mixing the cerium oxide dispersion prepared in Example 1 with the polishing additive composition of Comparative Preparation Example 3.

Comparative Example 4

A polishing slurry composition was prepared by mixing the cerium oxide dispersion prepared in Example 1 with the polishing additive composition of Comparative Preparation Example 4.

Experimental Example

Polishing was performed with the polishing slurry compositions of the Examples and Comparative Examples above in the CMP apparatus manufactured by G & P Technology Co., Ltd., using an SKW 3-2 patterned wafer (manufactured by SKW by depositing a silicon oxide film having a thickness of about 8,000 Å with a step difference of about 6,000 Å in an uneven part), while controlling the rotational speeds of the platen and head to be 93 rpm and at 87 rpm, respectively, controlling the pressure to be 300 g/cm$^2$, and supplying the slurry composition at a supply rate of 100 mL/min. After the CMP process, the polishing amount of the nitride film, polishing amount of the oxide film, and amount of dishing occurrence were measured. The results thereof are shown in Table 1 below.

Polishing Conditions i) Polisher: GNP POLI400 ii) Pad: IC-1000 (manufactured by DOW Chemical Company)

iii) Polishing time: Over polishing based on OPA500 iv) Rotation speeds of head and spindle: 93 rpm and 87 rpm, respectively v) Head pressure: 300 g/cm$^2$ vi) R-ring pressure: 360 g/cm$^2$ vii) Flow rate: 100 ml/min

Measurement of Pattern Density

The pattern density 20% (D20) means that a high step portion (line) had a width of 20 μm, and a low step portion (space) had a width of 80 μm, and thus the high step portion had a density of 20%. Measurement was conducted by defining the difference in thickness (height difference; step height) between the high step portion (line) and the low step portion (space) as the dishing level, and using an apparatus for measuring the optical thickness.

TABLE 1

| | Molecular Weight | PDI | Ox. R/R (Å/min) | Nit. R/R (Å/min) | Selectivity | D20 Nit Erosion (Å) | Dishing level (Å) |
|---|---|---|---|---|---|---|---|
| Example 1 | 25K | 4.57 | 3385 | 65 | 52 | 23 | 263 |
| Example 2 | 10K + 25K | 4.13 | 2882 | 77 | 37 | 39 | 464 |
| Example 3 | 25K + 40K | 4.06 | 3147 | 80 | 39 | 44 | 505 |
| Example 4 | 10K + 25K + 40K | 4.38 | 3043 | 68 | 43 | 31 | 318 |
| Comparative Example 1 | 10K | 2.84 | 2694 | 81 | 33 | 75 | 803 |
| Comparative Example 2 | 25K | 3.18 | 3117 | 84 | 37 | 69 | 734 |
| Comparative Example 3 | 40K | 2.22 | 3293 | 89 | 37 | 81 | 827 |
| Comparative Example 4 | 25K | 2.21 | 2860 | 94 | 30 | 114 | 1040 |

As can be seen from the above Examples and Comparative Examples, it could be confirmed that when the polishing additive composition of the present invention, comprising the polyacrylic acid in which the PDI of the anionic polymer was high, was used in a polishing slurry composition, the passivation of the silicon nitride film during the polishing process increased, thus resulting in the minimization of erosion, the loss of the silicon oxide film in the trench portion was reduced, and the polishing rate for the silicon oxide film was maintained and improved, while reducing the polishing rate for the silicon nitride film, thus resulting in improvement of the selectivity and reduction of the dishing.

The polishing additive composition of the present invention can increase the passivation of the silicon nitride polishing stopper film in the chemical mechanical polishing process during the process for manufacturing a semiconductor element through the broad polymer distribution index (PDI of 3.5 to 5.5) of the anionic polymer, thereby making it possible to reduce the loss of the silicon nitride film, thus resulting in minimization of the erosion. In addition, the loss of the silicon oxide film in the trench portion can be reduced, thus resulting in improvement of the dishing, and thus the polishing additive composition is suitable for the STI process.

Reference Numerals

100 Semiconductor Substrate
101 Pad Silicon Oxide Film
102 Silicon Nitride Film
103 Trench
104 Insulating Silicon Oxide Film

What is claimed is:

1. A polishing additive composition comprising:
an anionic polymer, a cationic compound, a nonionic surfactant, a dishing inhibitor, and an amphoteric ionic compound,
wherein the anionic polymer has a polymer distribution index (PDI) of 4.0 to 5.0,
wherein the anionic polymer comprises a blend of two or more polymers having different weight average molecular weights,
wherein the nonionic surfactant comprises at least one selected from the group consisting of glycerin, polyglycerin, and polyvinyl alcohol.

2. The polishing additive composition of claim 1, wherein the weight average molecular weight (g/mol) of the anionic polymer is 10,000 to 50,000.

3. The polishing additive composition of claim 1, wherein the anionic polymer is a polymer comprising a repeating unit derived from at least one monomer selected from the group consisting of acrylic acid, methacrylic acid, maleic acid, and styrenesulfonic acid, or a blend thereof.

4. The polishing additive composition of claim 1, wherein the anionic polymer is at least one polymer selected from the group consisting of polyacrylic acid, polymethacrylic acid, polymaleic acid, and polystyrene sulfonic acid.

5. The polishing additive composition of claim 1, wherein the cationic compound simultaneously comprises a hydrophilic moiety and a hydrophobic moiety in the molecule.

6. The polishing additive composition of claim 1, wherein the dishing inhibitor comprises at least one selected from the group consisting of polyamino acid-based polymers, polyurethane-based polymers, and polysaccharide-based polymers.

7. The polishing additive composition of claim 1, wherein the amphoteric ionic compound comprises at least one selected from the group consisting of an amino acid and an amino alcohol.

8. A polishing slurry composition comprising:
a polishing agent including cerium oxide particles and an anionic dispersant; and
the polishing additive composition of claim 1,
wherein a pH of the polishing agent is 8.5.

9. The polishing slurry composition of claim 8, wherein the zeta potential of the surface of the cerium oxide particles is −30 mV to −50 mV.

10. The polishing slurry composition of claim 8, wherein the anionic dispersant comprises at least one selected from the group consisting of polymaleic acid, polystyrene sulfonic acid, polyacrylic acid, polymethacrylic acid, and a salt thereof.

11. A method for polishing an insulating film of a semiconductor element, the method comprising:
polishing an insulating film, which is formed on a substrate, with the polishing slurry composition of claim 8 to remove a step involved in the insulating film.

12. The method of claim 11, wherein the polishing of the insulating film is performed by placing the substrate on a rotating plate, the substrate having the insulating film formed thereon, contacting a surface of the insulating film with a polishing pad of a polisher, and rotating the rotating plate and the polishing pad while supplying the polishing slurry composition.

13. The method of claim 11, wherein the insulating film comprises a silicon oxide film and a silicon nitride film.

14. The method of claim 13, wherein the selectivity of the silicon oxide film and the silicon nitride film is equal to or greater than 30:1.

15. The method of claim 13, wherein the dishing level of the silicon oxide film is 600 Å or less.

16. The method of claim 13, wherein the erosion of the silicon nitride film is 50 Å or less.

* * * * *